United States Patent
Yazawa et al.

(10) Patent No.: US 7,167,778 B2
(45) Date of Patent: Jan. 23, 2007

(54) ELECTRONIC DEVICE COOLING APPARATUS AND METHOD FOR COOLING ELECTRONIC DEVICE WITH TEMPERATURE PREDICTION

(75) Inventors: Kazuaki Yazawa, Chiba (JP); Iwao Takiguchi, Kanagawa (JP); Tetsuji Tamura, Tokyo (JP); Atsuhiko Imai, Tokyo (JP); Kenichi Adachi, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 11/140,491

(22) Filed: May 27, 2005

(65) Prior Publication Data

US 2005/0273208 A1    Dec. 8, 2005

(30) Foreign Application Priority Data

Jun. 3, 2004    (JP)    ............................. 2004-166443

(51) Int. Cl.
*G05D 23/00*    (2006.01)
*H01L 23/34*    (2006.01)

(52) U.S. Cl. ...................... 700/300; 361/688; 257/712

(58) Field of Classification Search ........ 700/276–278, 700/299, 300; 361/687–723; 165/80.1–80.5, 165/104.33; 257/712–722, E23.08, E23.082; 702/130–136

See application file for complete search history.

(56) References Cited

U.S. PATENT DOCUMENTS

| | | | |
|---|---|---|---|
| 6,134,667 A * | 10/2000 | Suzuki et al. ............... | 713/300 |
| 6,321,696 B1 * | 11/2001 | Nishioka et al. ......... | 123/41.15 |
| 6,516,282 B1 * | 2/2003 | Hedlund et al. ............ | 702/132 |
| 6,996,441 B1 * | 2/2006 | Tobias ......................... | 700/44 |
| 2002/0156595 A1 * | 10/2002 | Hedlund et al. ............ | 702/132 |
| 2003/0125900 A1 * | 7/2003 | Orenstien et al. ........... | 702/132 |
| 2004/0041035 A1 * | 3/2004 | Takei et al. ................. | 236/34.5 |
| 2004/0098174 A1 * | 5/2004 | Suda et al. .................. | 700/299 |
| 2005/0024828 A1 * | 2/2005 | Espinoza-Ibarra et al. .. | 361/695 |
| 2005/0146850 A1 * | 7/2005 | Meir ........................... | 361/687 |
| 2005/0174737 A1 * | 8/2005 | Meir ........................... | 361/697 |
| 2005/0216222 A1 * | 9/2005 | Inoue .......................... | 702/136 |
| 2005/0216775 A1 * | 9/2005 | Inoue .......................... | 713/300 |
| 2006/0013281 A1 * | 1/2006 | Sri-Jayantha et al. ....... | 374/163 |

FOREIGN PATENT DOCUMENTS

JP    2001-345218 A    * 12/2001

* cited by examiner

*Primary Examiner*—Maria N. Von Buhr
(74) *Attorney, Agent, or Firm*—Katten Muchin Rosenman LLP

(57) ABSTRACT

A temperature predicting unit predicts the temperature of an electronic device after a predetermined period, and the speed of temperature variation from the operating state of the load. Based on the results of prediction by the temperature predicting unit, a selection unit instructs either one or both of a nozzle control unit and an electric fan control unit to exercise control. According to a control signal from the selection unit, the nozzle control unit transmits a control signal to a nozzle unit to drive a jet cooling apparatus. According to a control signal from the selection unit, the electric fan control unit transmits a control signal to an electric fan unit to drive an electric fan. The selection unit selects the electric fan when the predicted speed of temperature variation exceeds a predetermined threshold, and selects the jet cooling apparatus when the predetermined thresholds is not exceeded.

22 Claims, 6 Drawing Sheets

ELECTRONIC DEVICE COOLING APPARATUS AND METHOD FOR COOLING ELECTRONIC DEVICE WITH TEMPERATURE PREDICTION

BACKGROUND OF THE INVENTION

1. Field of the Invention

The invention relates to a technology for cooling an electronic device, and more particularly to a technology for cooling an electronic device based on its surface temperature predicted in advance.

2. Description of the Related Art

Electronic equipment is controlled by various types of electronic devices such a CPU (Central Processing Unit) and a DSP (Digital Signal Processor), which are made of various electronic components including active elements such as a transistor and passive elements such as a capacitor. Part of electric energy for driving these electronic components is converted into thermal energy and dissipated as heat. The performance of the electronic components typically has temperature dependence. Then, the dissipated heat has an effect on the performance of the electronic components, and by extension that of the electronic devices. Technologies for cooling the electronic devices are thus of significant importance in controlling the electronic devices properly.

An example of the technologies for cooling the electronic devices is an air cooling method which uses electric fans. In this method, for example, an electric fan is arranged opposite to the surface of an electronic device. Cool air is sucked from an air inlet and blown onto the surface of the electronic device by the electric fan. The air is warmed by absorbing heat occurring from the surface of the electronic device, and is emitted from an air outlet. In this way, the heat occurring from the surfaces of the electronic devices is exhausted by electric fans, whereby the electronic devices are cooled.

Devices intended for heat dissipation, called heat sinks, are also used commonly. In order to transfer heat from the heat source such as an electronic device to surrounding cool fluid or air efficiently, heat sinks are usually designed to have large areas of heat transfer. The heat caused by an electronic device is transferred to a heat sink, and is dissipated through the large area of heat transfer of the heat sink.

This method of using an electric fan and a heat sink in combination is the technique that is commonly used for cooling a semiconductor chip.

Temperature changes of the foregoing electric fans and heat sinks typically have considerably poor time responses as compared to variations in the amounts of heat to be generated by the electronic devices. In other words, these conventional cooling methods have had difficulties in cooling the electronic devices efficiently since the amounts of heat generated by the electronic devices can vary with time. To ensure the reliability of operation of the electronic devices, it is therefore necessary to provide margins for cooling power. There have thus been the problems that the electric fans grow in power consumption and noise, and that the electric fans must have excessively large volumes.

SUMMARY OF THE INVENTION

The present invention has been achieved in view of the foregoing problems. It is thus an object of the present invention to provide a technology for cooling an electronic device effectively.

One of the aspects of the present invention is an electronic device cooling apparatus. This apparatus comprises: a predicting unit which predicts a temperature of an electronic device from an operating load; and a control unit which controls a cooling unit based on the predicted temperature, the cooling unit cooling the electronic device. The control unit may select and operate a desired cooling unit out of a plurality of cooling units having different cooling time responses, depending on a speed of change of the predicted temperature. The control unit may select and operate a desired cooling unit out of a plurality of cooling units having different cooling efficiencies, depending on the speed of change of the predicted temperature. When the speed exceeds a predetermined threshold, a cooling unit of spray type may be selected.

The "cooling time responses" may be determined, for example, based on the times necessary for the cooling units to lower the temperature of an object to be cooled to its original temperature when the object to be cooled rises in temperature stepwise. The "cooling efficiencies" may pertain to a certain band of time during a cooling period, or a certain location on the electronic device.

The control unit of the apparatus may decrease a target value of temperature control of the cooling unit for cooling when a rise in temperature is predicted. The control unit may increase the target value of temperature control of the cooling unit for cooling when a drop in temperature is predicted. The target value can be adjusted to control a difference between the current temperature and the target value. The operation level of the cooling unit which is controlled in accordance with the difference can thus be controlled in advance.

Another aspect of the present invention is also an electronic device cooling apparatus. This device comprises: a measuring unit which measures a temperature of an electronic device; a control unit which exercises feedback control on a cooling unit so as to eliminate an offset between the measured temperature and a predetermined control target value; and a predicting unit which predicts the temperature of the electronic device from an operating load. The control unit adjusts the control target value based on the predicted temperature. The control unit may introduce an integral term into the feedback control.

Another aspect of the present invention is an electronic device system. This system comprises: an electronic device; at least one cooling unit which cools the electronic device; a predicting unit which predicts a temperature of the electronic device from an operating load; and a control unit which controls the cooling unit based on the predicted temperature.

Incidentally, any combinations of the foregoing components, and the expressions of the present invention converted among methods, apparatuses, systems, recording media, computer programs, and the like are also intended to constitute applicable aspects of the present invention.

DETAILED DESCRIPTION OF THE INVENTION

Heat occurring from the surface of an electronic device such as a CPU and a DSP results from the dissipation of thermal energy into which the electric energy supplied to electronic components inside the electronic device and to conducting wires between the electronic components is converted. This heat does not necessarily occur from the surface of the electronic device steadily. Depending on the processing performed by the electronic device, there may be instantaneous increases in the amount of heat generated. Heat can also be generated instantaneously even when the amount of heat occurring from the surface of the electronic device is near its maximum. Among cooling methods appropriate to such instantaneous heat generation is one based on the principle of jet cooling. The jet cooling refers to a cooling method in which a heat generating article such as an electronic device is cooled by spraying a refrigerant onto the heat generating article.

The jet cooling is known as a cooling method which allows high efficiency of heat transfer locally. This method is effective at cooling high heat that occurs locally, such as in a cutting operation. The refrigerant is sprayed out of a cooling nozzle onto the heat generating article for cooling. As employed herein, the "refrigerant" refers to a gas such as air or a liquid such as water, or in other words a medium for absorbing and exhausting heat occurring from the surface of the electronic device. In a plane vertical to the flow of the sprayed refrigerant, the heat transfer shows a concentric distribution about the axial point of the jet. Here, "the axial point of the jet" shall refer to a point at which the axis of the jet from the cooling nozzle crosses the surface of the object to be cooled.

A heat transfer coefficient $h_0$ [W/m²K] is given by the following equation (1):

$$h0 = \lambda_r \cdot Nu_0 / r_0 \tag{1}$$

where $r_0$ [m] is the radius of the jet, and $\lambda_f$ [W/mK] is the heat transfer coefficient of the refrigerant. $Nu_0$ is an average Nusselt number for the radius of the jet of $r_0$ [m]. $Nu_0$ is given by the following equation (2):

$$Nu_0 = 1.25 \cdot Pr^{0.45} \cdot Re^{0.45}, \tag{2}$$

where Pr is a constant called Prandtl number, and Re is the Reynolds number. Re is expressed by the following equation (3):

$$Re = u_0 \cdot d_0 / v, \tag{3}$$

where $u_0$ [m/s] is a representative speed determined by dividing the volumetric flow rate of the jet by the sectional area of the opening of the cooling nozzle. $d_0$ [m] is the diameter of the nozzle opening, and v [s/m²] is the viscosity of the fluid.

By the jet cooling, high cooling effect can be obtained near the axial point of the jet. For still higher cooling effect, a plurality of cooling nozzles may be arranged closely to the surface of the object to be cooled.

Figure 1:
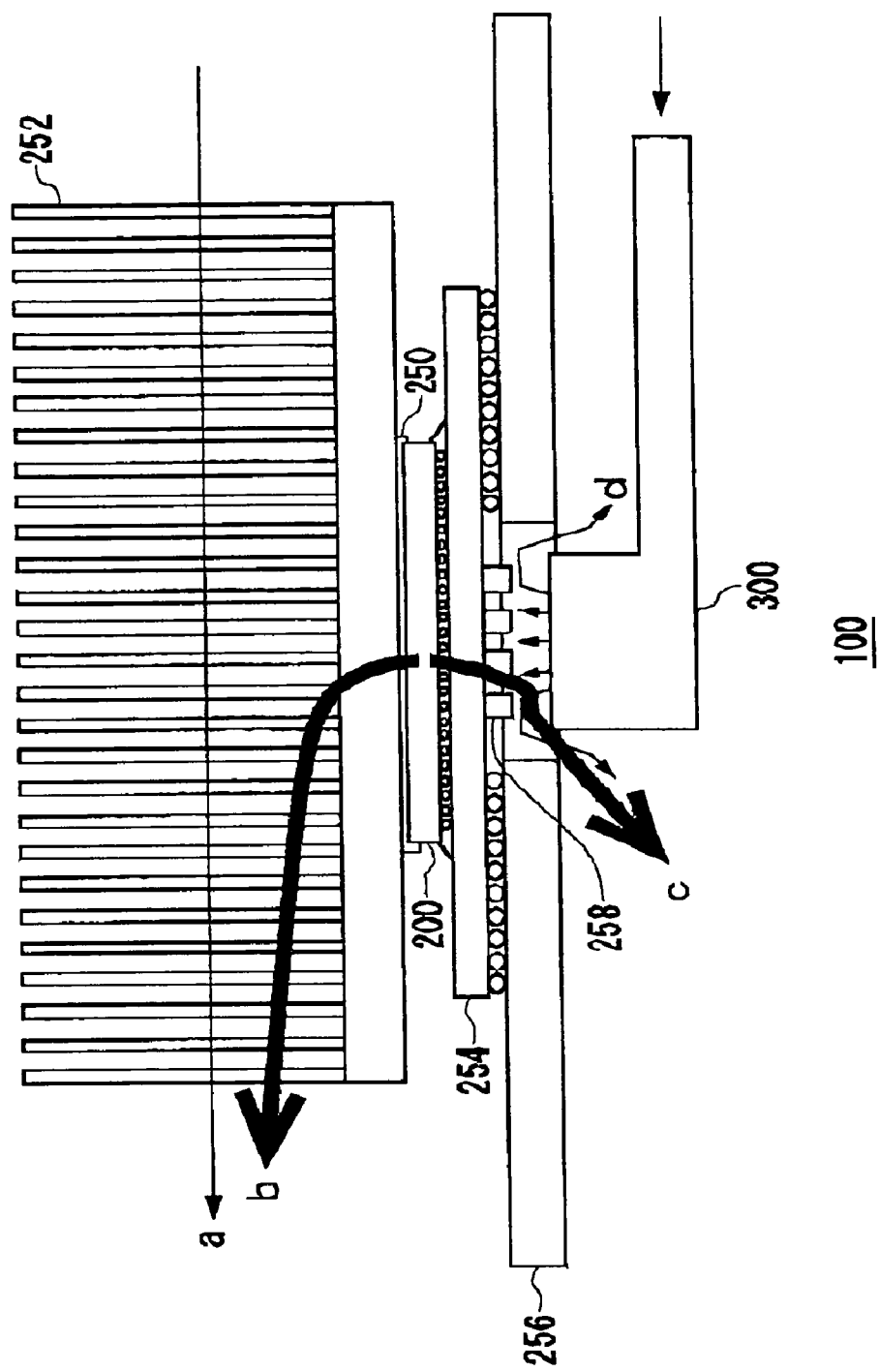
FIG. 1 is a schematic diagram showing the mechanism of an electronic device cooling apparatus.

FIG. 1 is a schematic diagram showing the mechanism of an electronic device cooling apparatus 100 according to an embodiment. An electronic device 200 is the heat generating article and is the object to be cooled. A spreader 250 is attached to the top of the electronic device 200. The spreader 250 is usually made of copper. A heat sink 252 is further placed on the spreader 250. Heat occurring chiefly from the top of the electronic device 200 is transferred to the heat sink 252 through the spreader 250. The heat sink 252 has large areas of heat transfer to the external air. A not-shown electric fan sends air to the heat sink 252, so that the warmed air near the heat transfer surfaces of the heat sink 252 can be exhausted with efficiency. In the diagram, the arrow "a" represents the forced flow from the electric fan. The arrow "b" represents an ordinary flow of heat, and the arrow "c" an unsteady auxiliary flow of heat. The electronic device 200 and the heat sink 252 may be contacted directly.

The heat sink 252 may be configured so that it is exposed to a coolant. Here, the surface of the electronic device 200 is covered with a waterproof case, and the coolant is introduced to the heat sink 252. The coolant is warmed by absorbing the heat transferred from the electronic device 200 to the heat sink 252, and is drained from a coolant outlet.

The electronic device 200 is mounted on a package substrate 254. The package substrate 254 plays the role of an intermediate plate for mounting the electronic device 200 onto a mounting board 256. The mounting board 256 is bonded to the package substrate 254 by soldering. The package substrate 254 and the mounting board 256 are typically spaced by 300 to 500 micrometers or so. Several capacitors 258 are usually bonded to a side of the package substrate 254 closer to the mounting board 256. When these capacitors 258 have some capacitances, it is sometimes impossible to accommodate these capacitors 258 within the size of around 300 to 500 micrometers. For this reason, the mounting board 256 typically has an opening as shown in the diagram, i.e., where to lie directly under the electronic device 200 so that the height for installing the capacitors 258 is secured.

Through this opening, a jet cooling apparatus 300 sprays a refrigerant to the package substrate 254 upward. The jet cooling apparatus 300 has a plurality of refrigerant nozzle openings. The spray mechanism of the jet cooling apparatus 300 will be detailed later. The refrigerant sprayed from the jet cooling apparatus 300 is recovered into a not-shown refrigerant recovery hole. In the diagram, the arrows "d" represent the routes of the refrigerant fluid. If the refrigerant is liquid, the refrigerant warmed by the heat occurring from the electronic device 200 may be recovered by a known capillary-based method, or by power such as a pump. The recovered refrigerant is cooled by the external air. The refrigerant is supplied again to the jet cooling apparatus 300. When the refrigerant is air, it may be discharged after the jetting.

The refrigerant nozzle openings of the jet cooling apparatus 300 are given a diameter of approximately ⅓ the distance between the top of the jet cooling apparatus 300 and the package substrate 254. For example, assuming that the distance is 6 millimeters or so, the refrigerant nozzle openings are given a diameter of 2 millimeters or so. The refrigerant nozzle openings of the jet cooling apparatus 300 are disposed to both the center and the periphery. When it is assumable in advance that some portions of the electronic device 200 generate larger amounts of heat locally, the refrigerant nozzle openings at the corresponding positions may be given larger diameters. The reason for this is that the greater diameters the refrigerant nozzle openings have, the higher the heat transfer coefficients are as shown by the foregoing equation of the jet cooling.

The jet cooling apparatus 300 may spray the refrigerant directly onto the surface of the package substrate 254 for cooling. Alternatively, it may spray the refrigerant onto a case, which covers the surface of the package substrate 254, for indirect cooling. That is, the effect of the present invention can be provided equally as long as the jet cooling apparatus 300 is configured to exhaust the heat occurring from the electronic device 200 by jet cooling. For example, the same mechanism as the jet cooling mechanism 300 may be arranged inside the heat sink 252. More specifically, in this configuration, the heat occurring steadily from the top of the electronic device 200 as removed by the heat sink 252 and the electric fan. In the meantime, heat occurring instantaneously can be removed in such a way that the jet cooling apparatus 300 arranged in the heat sink 252 sprays the refrigerant to the top of the electronic device 200.

Incidentally, the opening formed in the mounting board 256 need not necessarily be in the center of the mounting board 256 as shown in the diagram. For example, an opening may be formed in consideration of the locality of heat generation in the electronic device 200. A plurality of openings may also be formed. Moreover, a plurality of holes may be formed through the mounting board 256 so that the refrigerant is sprayed to a plurality of locations on the package substrate 254 through the respective holes.

The electronic device 200 contains a plurality of heat detecting sensors for detecting the amount of heat generated inside. The heat detecting sensors may be arranged on the electronic device 200 or the package substrate 254. The heat detecting sensors may be infrared sensors or the like which detect the amount of generated heat by detecting infrared rays emitted from the surface of the electronic device 200. The heat detecting sensors may be thermometers which measures the temperature inside the electronic device 200.

In general, the heat occurring from the electronic device 200 is transferred through the spreader 250 to the heat sink 252, and is dissipated from the heat transfer surfaces thereof. When the amount of heat dissipated from the heat sink 252 is large, the heat can be removed more efficiently by, for example, sending air to the heat sink 252 from the electric fan. As a result, the electronic device 200 can be cooled more powerfully. Depending on the amount of heat occurring from the electronic device 200, the number of revolutions of the electric fan can be controlled to exercise cooling according to the amount of heat generated. The following example will deal with the case where the heat sink 252 and the electric fan are used as a cooling unit for cooling the electronic device 200.

Now, the electronic device 200 may sometimes generate heat instantaneously. With the instantaneous generation of heat, i.e., when the amount of heat generated per unit time increases sharply, the jet cooling apparatus 300 is driven for cooling. The refrigerant is sprayed from the jet cooling apparatus 300 toward the package substrate 254. Part of the hear occurring from the electronic device 200 is conducted to the package substrate 254. The package substrate 254 is cooled by the jet cooling apparatus 300 spraying the refrigerant. The heat conducted to the package substrate 254 is thus exhausted through the opening in the mounting board 256. If it is previously known that some locations on the surface of the electronic device 200 tend to be high in temperature, the jet cooling apparatus 300 may be configured so that the refrigerant nozzles of the jet cooling apparatus 300 are concentrated on those locations. The jet cooling by the cooling nozzle(s) can effectively exhaust the heat occurring near the axial point(s) of the jet in particular. The more the cooling nozzles are and the higher the refrigerant spraying power of the cooling nozzles is, the higher the cooling effect becomes.

Figure 2:
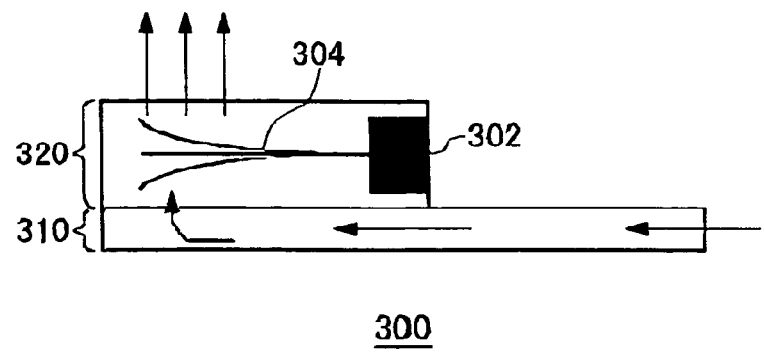
FIG. 2 is a diagram showing a first example of a mechanism by which a jet cooling apparatus sprays a refrigerant.
Figure 3:
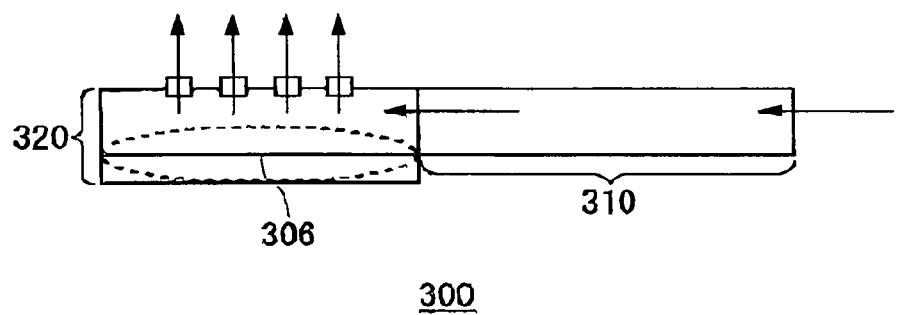
FIG. 3 is a diagram showing a second example of the mechanism by which the jet cooling apparatus sprays the refrigerant.
Figure 4:
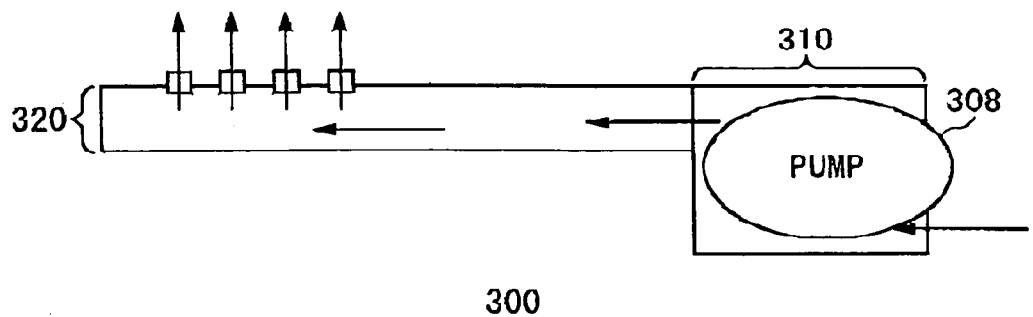
FIG. 4 is a diagram showing a third example of the mechanism by which the jet cooling apparatus sprays the refrigerant.

FIGS. 2 to 4 are diagrams showing mechanisms by which the jet cooling apparatus 300 sprays the refrigerant.

FIG. 2 is a diagram showing a first example of the mechanism by which the jet cooling apparatus 300 sprays the refrigerant. The jet cooling apparatus 300 includes a refrigerant supply channel 310 and a chamber unit 320. The refrigerant introduced into the refrigerant supply channel 310 is conveyed to the chamber unit 320. The chamber unit 320 stores the refrigerant temporarily. A plurality of refrigerant nozzle openings are formed in the top of the chamber unit 320. These refrigerant nozzle openings function as cooling nozzles. A fan driving unit 302 is made of a piezoelectric device or the like, for example, and drives a fan 304. When a predetermined voltage is applied to the fan driving unit 302, the fan driving unit 302 causes deformation according to the voltage. This deformation is transmitted to the fan 304, and the fan 304 functions to wave. As a result, the refrigerant introduced into the chamber unit 320 is sprayed out of the refrigerant nozzle openings in the top of the chamber unit 320.

FIG. 3 is a diagram showing a second example of the mechanism by which the jet cooling apparatus 300 sprays the refrigerant. Even in the example of this diagram, the jet cooling apparatus 300 includes a refrigerant supply channel 310 and a chamber unit 320. The refrigerant introduced into the refrigerant supply channel 310 is conveyed to the chamber unit 320. The chamber unit 320 stores the refrigerant temporarily. A plurality of refrigerant nozzle openings are formed in the top of the chamber unit 320. These refrigerant nozzle openings function as cooling nozzles. According to a control signal from exterior, a nor-shown driving unit drives a movable membrane 306 by such means as an electrostatic forcer a piezoelectric device, or a magnetic force. The refrigerant stored in the chamber unit 320 is pushed out of the refrigerant nozzle openings in the top of the chamber unit 320 by the movable membrane 306, whereby the refrigerant is sprayed.

FIG. 4 is a diagram showing a third example of the mechanism by which the jet cooling apparatus 300 sprays the refrigerant. The jet cooling apparatus 300 includes a refrigerant supply channel 310 and a chamber unit 320. The refrigerant introduced into the refrigerant supply channel 310 is conveyed to the chamber unit 320. The chamber unit 320 stores the refrigerant temporarily. A plurality of refrigerant nozzle openings are formed in the top of the chamber unit 320. These refrigerant nozzle openings function as cooling nozzles. The refrigerant supply channel 310 includes a pump 308. The pump 308 conveys the refrigerant introduced to the refrigerant supply channel 310 to the chamber unit 320. Here, the refrigerant introduced to the refrigerant supply channel 310 is forced into the chamber unit 320 by the pump 308 with high pressure. As a result, the refrigerant introduced into the chamber unit 320 is sprayed out of the refrigerant nozzle opening in the top of the chamber unit 320.

Figure 5:
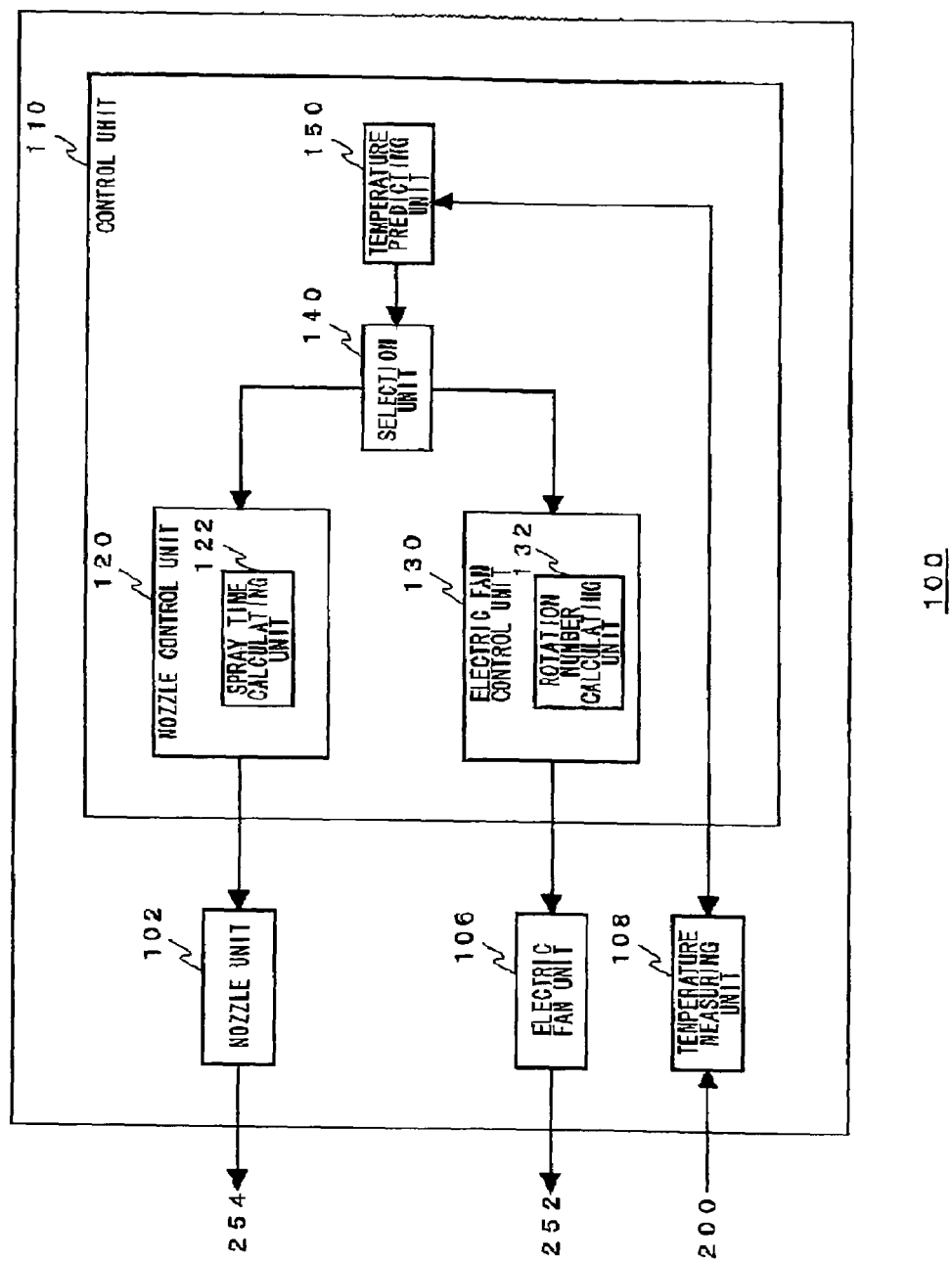
FIG. 5 is a functional block diagram of the electronic device cooling apparatus.

FIG. 5 is a functional block diagram of the electronic device cooling apparatus 100. In terms of hardware, the individual blocks shown here can be achieved by devices and mechanical apparatuses, including a computer CPU. In terms of software, they can be achieved by a computer program and the like. Here, the shown functional blocks are achieved by cooperation thereof. It will therefore be understood by those skilled in the art that these functional blocks can be realized in various forms depending on the combination of hardware and software.

A control unit 110 exercises integrated control on the cooling mechanism of the electronic device cooling apparatus 100. A nozzle unit 102 is a mechanical system for spraying the refrigerant onto the package substrate 254. The jet cooling apparatus 300 typically corresponds to the nozzle unit 102. An electric fan unit 106 is a mechanism for sending air to the heat sink 252. The electric fan that has been described in conjunction with FIG. 1 shall mainly correspond to the electric fan unit 106. A temperature measuring unit 108 measures the temperature of the electronic device 200 based on the amount of heat detected by the heat detecting sensors arranged in the electronic device 200. A thermometer may be arranged inside the electronic device 200 so that the temperature measuring unit 108 measure the temperature of the electronic device 200 directly.

The control unit 110 includes a nozzle control unit 120, an electric fan control unit 130, a selection unit 140, and a temperature predicting unit 150. The nozzle control unit 120 transmits control signals to control the nozzle unit 102. For example, given that the jet cooling apparatus 300 has the configuration described in conjunction with FIG. 2, the nozzle control unit 120 applies a predetermined voltage to the fan driving unit 302 to control the nozzle unit 102. The electric fan control unit 130 transmits control signals to control the electric fan unit 106. The nozzle control unit 120 further contains a spray time calculating unit 122. The electric fan control unit 130 contains a rotation number calculating unit 132. The temperature predicting unit 150 predicts the temperature of the electronic device 200 after a predetermined period, and the degree of rise in temperature per unit time, i.e., the speed of the temperature variation from the operating state of the load. Based on the results of prediction by the temperature predicting unit 150, the selection unit 140 instructs either one or both of the nozzle control unit 120 and the electric fan control unit 130 to exercise control.

According to a control signal from the selection unit 140, the electric fan control unit 130 transmits a control signal to the electric fan unit 106 to drive the electric fan. The rotation number calculating unit 132 calculates the number of rotations of the electric fan in accordance with a target temperature of the temperature control. As employed herein, the number of rotations may refer to either the number of rotations per unit time, i.e., the rotation speed of the electric fan, or the total number of rotations of the electric fan, i.e., the driving time of the same. When the electronic device 200 has a high surface temperature, the electric fan control unit 130 instructs the electric fan unit 106 to rotate the electric fan at high speed. Alternatively, the electric fan control unit 130 instructs the electric fan unit 106 to rotate the electric fan for a long time.

According to a control signal from the selection unit 140, the nozzle control unit 120 transmits a control signal to the nozzle unit 102 to drive the jet cooling apparatus 300. The spray time calculating unit 122 calculates the time for spraying the refrigerant, in accordance with the target temperature of the temperature control. Depending on the speed of the temperature variation of the electronic device 200, the jet speed for the refrigerant to be sprayed at and the amount of the refrigerant to be sprayed may be calculated. When the nozzle unit 102 is controlled to spray the refrigerant repeatedly, the spray time calculating unit 122 may calculate the time ratio, or duty ratio, between the times when the jet cooling apparatus 300 sprays the refrigerant and when not. Based on the calculation of the spray time calculating unit 122, the nozzle control unit 120 transmits a control signal to the nozzle unit 102 so that the refrigerant is sprayed.

The nozzle control unit 120 can exercise control so that the refrigerant is sprayed out of refrigerant nozzle openings corresponding to the locations on the electronic device 200 where the amounts of heat generated are high. This allows effective cooling not only against instantaneous heat generation in the electronic device 200 but also against local heat generation in the electronic device 200.

Now, description will be given in detail of the temperature prediction by the temperature predicting unit 150. A first example will deal with the technique of predicting a future temperature of the electronic device 200 by calculating the amount of generated heat from the operating load, the power supply voltage, and the operating frequency of the electronic device 200.

The temperature predicting unit 150 estimates the temperature after a period $\Delta t$, based on the current temperature input from the temperature measuring unit 108 and an estimated amount of heat generation E. The temperature $T_{t+\Delta t}$ after the period $\Delta t$ is expressed by the following equation (4);

$$T_{t+\Delta t} = f(T_t, E) \tag{4}$$

where $T_t$ is the current temperature, and E is the estimated amount of heat to be generated in this period $\Delta t$. As above, the temperature $T_{t+\Delta t}$ after the period $\Delta t$ is determined as a function of the current temperature $T_t$ and the estimated amount of heat generation E. This period $\Delta t$ may be set arbitrarily by a designer.

The estimated amount of heat generation E is given by the following equation (5);

$$E = \int [\alpha \cdot C \cdot Vdd^2 \cdot f] dt, \tag{5}$$

where $\alpha$ is a predetermined proportionality factor, C is a variable for expressing the load in equivalent capacitance, Vdd is the power supply voltage, and f is the operating frequency. The power supply voltage Vdd is squared in the equation. These terms are multiplied and integrated with respect to the foregoing $\Delta t$, thereby determining the estimated amount of heat generation E.

The temperature predicting unit 150 consults a not-shown task manager or the like, and identifies the load C to be used in the foregoing period $\Delta t$. Incidentally, the load C in the foregoing equation (5) is a total sum of loads in the electronic device 200. In this respect, the temperature predicting unit 150 may otherwise determine the estimated amounts of heat generation E1 to En of respective blocks after the foregoing period $\Delta t$, and then add all the calculations.

Here, the blocks refer to small areas, or targets of the is heat generation control, into which the entire area of the electronic device 200 is sectioned. Each of the blocks contains a single transistor or a group of a certain number of transistors constituting the electronic device 200. The blocks are sectioned in the sizes of respective spots where heat generation peaks. The sizes of the blocks may be determined freely in accordance with the desired precision of the heat generation control and the specification requirements of the electronic device 200. Moreover, the blocks may be sectioned in identical sizes systematically, or sectioned unevenly along the boundaries of various operation units.

Figure 6:
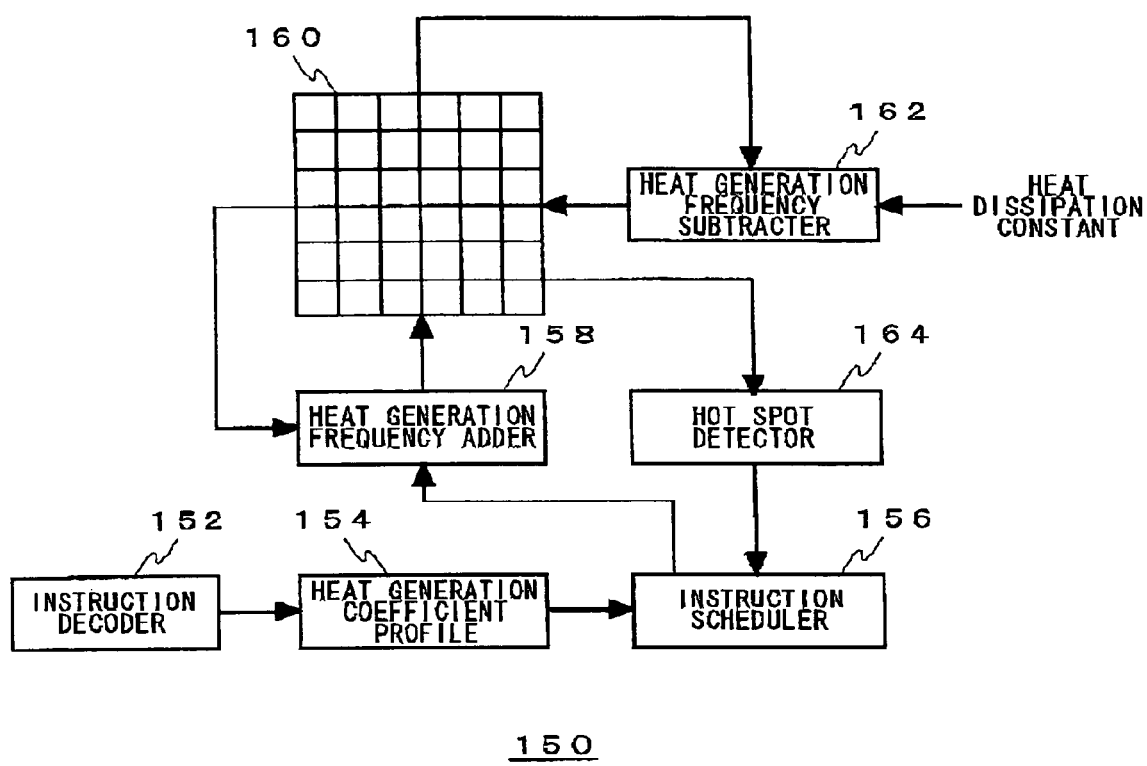
FIG. 6 is a functional block diagram showing an example of a temperature predicting unit.

A second example of the temperature prediction by the temperature predicting unit 150 will deal with the technique of predicting load variations by using hardware such as a decoder. FIG. 6 shows a detailed configuration of the temperature predicting unit 150 according to the second example. An instruction decoder 152 has a heat generation analysis function. Based on hardware information on the electronic device 200, the instruction decoder 152 identifies the blocks pertaining to the execution of respective instruction steps, predicts the amounts of heat to be generated by the operations of the blocks, and determines heat generation coefficients. The instruction decoder 152 stores position information on the blocks and the heat generation coefficients, identified for the respective instruction steps, into a heat generation coefficient profile 154 in association with the instruction steps.

The heat generation coefficient profile 154 is a profile containing the position information on the blocks of the electronic device 200 pertaining to the execution of the instruction steps and the heat generation coefficients pertaining to the amounts of heat generation of the blocks in association with each other step by step. The instruction steps refer to step-by-step instructions decoded by the instruction decoder 152, including such commands as MOV (move), ADD (addition), LD (load), and ST (store), accompanied with arguments. For example, an instruction step "MOV AX BX" is an instruction to let the contents of an arithmetic register BX of a not-shown CPU into another arithmetic register AX.

The positions of the foregoing blocks are expressed as indexes of a matrix when the die on the package substrate 254 of the electronic device 200 is sectioned into rectangular areas. The heat generation coefficients mentioned above are numeric values determined from the predicted amounts of heat to be generated when blocks lying in the areas indicated by the block positions perform the instructions.

Changes in the ON-OFF states of the transistors in the electronic devices 200 can be traced in fine time steps by utilizing the results of logic simulations on program codes after the LSIs of the electronic device 200 are laid out and wired completely. The use of the results allows full analysis as to which block is activated in each of the instruction steps.

The amounts of heat to be generated by the respective blocks can be predicted in consideration of static temperature characteristics of the blocks by using a CAD tool or the like at the time of circuit design. The static temperature characteristics of the blocks are quantified mainly based on physical properties and positional relationships between the elements. For example, when a CMOS inverts its value, both the P-channel and N-channel transistors thereof instantaneously turn on at the same time, causing a through current to flow. This through current contributes most of the power consumption of the CMOS, and the power consumption increases in proportion to the operating frequency of the CMOS. Such power consumptions can be estimated to predict the amounts of heat to be generated by the respective blocks. The heat generation coefficients are values obtained by quantizing the predicted amounts of heat generation. The information such as the results of simulations at the time of circuit design and the predicted amounts of heat generation are stored into a BIOS or the like as hardware information. The hardware information can be referred to by the instruction decoder 152.

An instruction scheduler 156 schedules the instructions decoded by the instruction decoder 152 based on data dependence, and selects a next instruction step to execute. The instruction scheduler 156 consults the heat generation coefficient profile 154 to identify the block position and the hear generation coefficient pertaining to the execution of the instruction step selected. The instruction scheduler 156 then supplies the resultant to a heat generation frequency adder 158. The heat generation frequency adder 158 reads the current frequency of heat generation at the identified block position from a block heat generation frequency register 160. It adds the heat frequency coefficient supplied from the instruction scheduler 156 to the current frequency, and writes the result to the block heat generation frequency register 160. The block heat generation frequency register 160 is a register for accumulating and storing the frequency of heat generation of each block.

A heat generation frequency subtracter 162 reads the frequencies of heat generation of the respective blocks from the block heat generation frequency register 160. It performs subtraction processing based on a predetermined heat dissipation constant, and writes the results to the block heat generation frequency register 160. The heat generation frequency subtracter 162 operates at predetermined clocks, thereby performing subtractions on the frequencies of heat generation of the respective blocks stored in the block heat generation frequency register 160. Consequently, the amounts of heat dissipation with time are reflected on the frequencies of heat generation stored in the block heat generation frequency register 160.

The heat generation frequency subtracter 162 performs subtractions until the frequencies of heat generation fall to zero. Here, the higher the frequencies of heat generation of the blocks are, the higher values shall be subtracted from the frequencies of heat generations. The reason for this is that the greater the difference between the temperature predicted from the frequency of heat generation of each block and the external temperature is, the faster the temperature drops due to heat dissipation. The external temperature may be any one of a measured value, an estimated value, and a predetermined value.

The heat generation frequency adder 158 and the heat generation frequency subtracter 162 may adjust the frequencies of heat generation of the blocks with consideration alas given to dynamic temperature characteristics of the respective blocks. The dynamic temperature characteristics of the blocks mainly depend on the history of execution of tasks and the load conditions. In some cases, physical properties also have an effect such that tasks simultaneously assigned to adjoining blocks tend to generate heat more than when tasks are distributed to separate blocks. The heat generation frequency adder 158 may add the frequencies of heat generation while taking account of such factors as the states of task assignment of the respective blocks and interactions ascribable to heat generation of adjoining blocks. The heat generation frequency subtracter 162 may perform subtractions on the frequencies of heat generation in consideration of the progress of heat dissipation around the blocks.

A hot spot detector 164 detects hot spots, or blocks of which the frequencies of heat generation stored in the block heat generation frequency register 160 exceed a predetermined threshold. The hot spot detector 164 supplies the positions of those blocks to the instruction scheduler 156. This predetermined threshold is the frequency of heat generation corresponding to a temperature that is lower than the temperature limit beyond which each block malfunctions. Consequently, the hot spot detector 164 detects not only blocks that actually are hot spots, but also ones having high possibilities to be hot spots in the future. Here, the hot spots refer to locations where the electronic device 200 becomes abnormally high in temperature. The hot spots occur from an uneven distribution of power consumption inside the electronic device 200.

By consulting the block heat generation frequency register 160, the instruction scheduler 156 can estimate the amounts of heat to be generated in the period Δt. Then, the amounts of heat to be generated can be let into the foregoing equation (4) to predict the temperatures after the period Δt.

In the foregoing configuration, the instruction decoder 152 identifies blocks for respective instruction steps based on the hardware information, and determines the heat generation coefficients. The heat generation coefficients, however, may be embedded as part of instruction operands at the stage of generation of the instruction code. For example, a programmer or a complier may specify heat generation coefficients instruction by instruction. In the second example, the amounts of heat generation are thus predicted in units of blocks with respect to each instruction step along the progress of the instruction code. It is therefore possible to grasp the temperature distribution on the electronic device 200 accurately at extremely fine levels in both temporal and spatial terms.

Incidentally, in the foregoing configuration, the amounts of heat generation are predicted and the frequencies of heat generation are counted with respect to each instruction step. Nevertheless, the amounts of heat generation may be predicted and the frequencies of heat generation be counted in units of certain task groups such as subroutines.

(First Embodiment)

Figure 7:
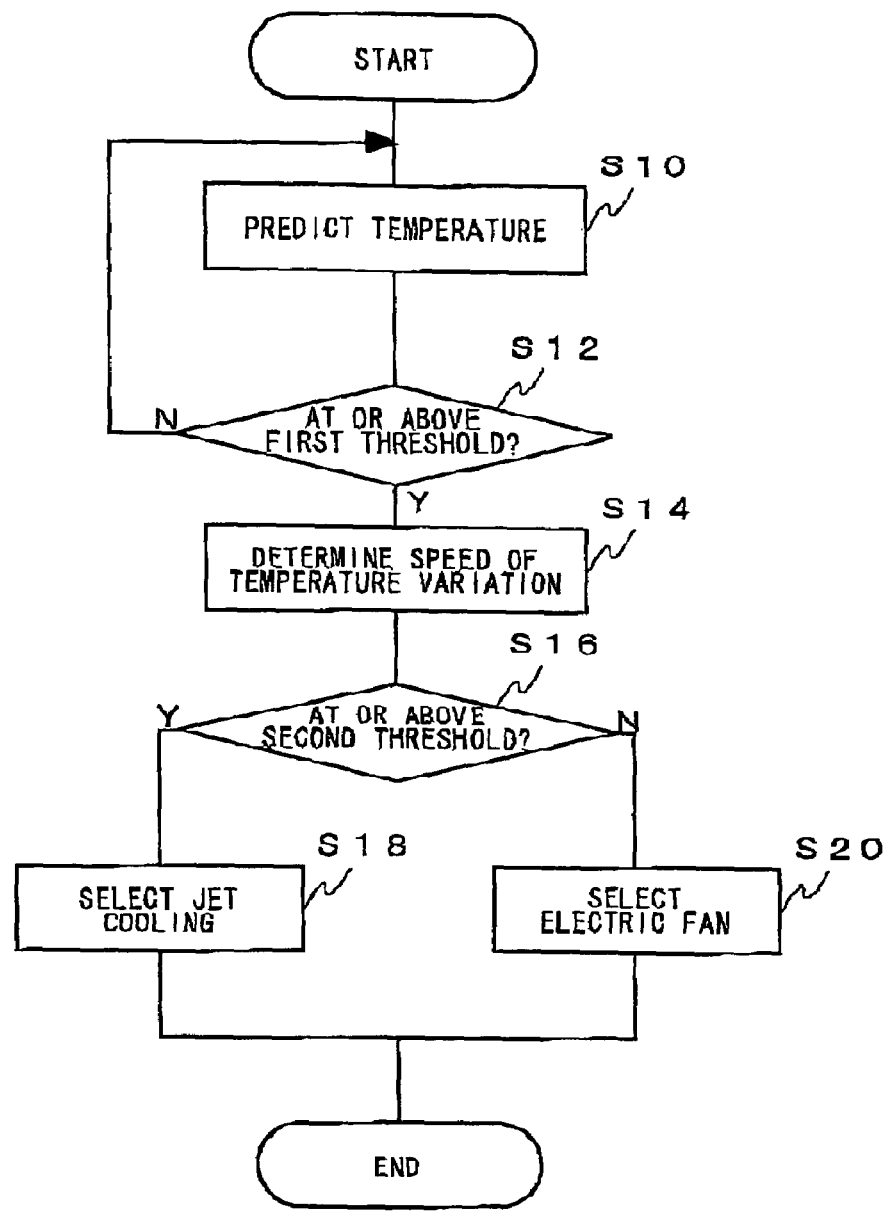
FIG. 7 is a flowchart showing the process of providing an electronic device according to a first embodiment.

A first embodiment will deal with the case where a plurality of cooling mechanisms having different time responses are used effectively depending on predicted temperature variations. FIG. 7 is a flowchart showing the process in which the electronic device cooling apparatus 100 according to the first embodiment cools the electronic device 200. The temperature predicting unit 150 predicts the temperature of the electronic device 200 after the period Δt (S10). The selection unit 140 determines whether this predicted temperature exceeds a predetermined threshold or not (S12). This predetermined threshold is a value determined arbitrarily by the designer, in accordance with the performance and the use environment of the electronic device 200. If the temperature exceeds this threshold, the proper operation of the electronic device 200 will no longer be guaranteed. Hereinafter, this threshold will be referred to as "first threshold". If the predicted temperature is lower than the first threshold (N in S12), the periodic temperature prediction is continued (S10). If the predicted temperature is higher than or equal to the first threshold (Y in S12), the temperature predicting unit 150 determines the speed of the temperature variation in the foregoing period Δt (S14).

The selection unit 140 determines whether this speed exceeds a predetermined threshold or not (S16). This predetermined threshold is a value that is set based on the time response of the electric fan to a temperature variation and the time response of the jet cooling apparatus 300 to a temperature variation. Hereinafter, this threshold will be referred to as "second threshold." Since the jet cooling apparatus 300 has a time response better than that of the electric fan, the cooling by the jet cooling apparatus 300 is preferred when the predicted temperature variation is sharp. On the other hand, if the predicted temperature variation is not sharp, the temperature of the first threshold will not be exceeded even when the cooling is effected by the electric fan. Here, the electric fan having a heat exhausting efficiency higher than that of the jet cooling apparatus 300 is preferably used for cooling. Consequently, the second threshold shall be given a value at which the cooling by the electric fan guarantees that the temperature of the first threshold will not be exceeded even with the foregoing speed of the temperature variation.

If the speed of the temperature variation is higher than or equal to the second threshold (Y in S16), the selection unit 140 transmits a selection signal to the nozzle control unit 120. The nozzle control unit 120 drives the nozzle unit 102 to spray the refrigerant (S18). If any hot spot is detected and a plurality of cooling nozzles are provided, control may be effected so that the refrigerant is sprayed onto the hot spot intensively. The nozzle unit 102 and the electric fan unit 106 may also be driven at the same time.

If the speed of the temperature variation falls below the second threshold (N in S16), the selection unit 140 transmits the selection signal to the electric fan control unit 130. The electric fan control unit 130 drives the electric fan unit 106 to rotate the electric fan (S20).

According to the first embodiment, a plurality of cooling mechanisms having different time responses can be selected in accordance with their characteristics, and used to cope with sharp variations in temperature. This also eliminates the need for measures against temperature overshooting which involve temperature control with design margins called guard band. Unnecessary overcooling can thus be avoided for effective heat removal.

(Second Embodiment)

In the configuration of a second embodiment, the nozzle unit 102, the nozzle control unit 120, and the selection unit 140 may be omitted from the electronic device cooling apparatus 100 shown in FIG. 5. Description will be given below, assuming a typical cooling mechanism with an electric fan.

Figure 8:
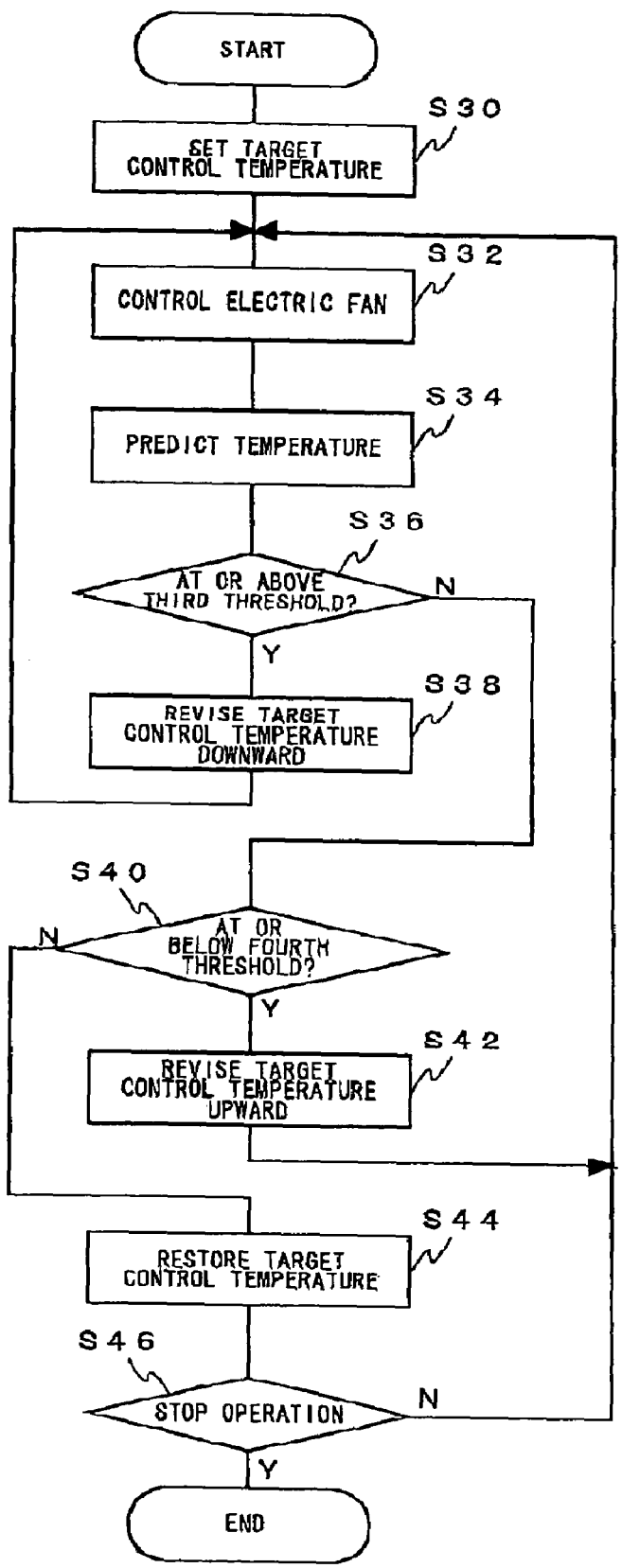
FIG. 8 is a flowchart showing the process of providing the electronic device according to a second embodiment.

FIG. 8 is a flowchart showing the process in which the electronic device cooling apparatus according to the second embodiment cools the electronic device. Initially, the temperature predicting unit 150 sets the electric fan control unit 130 with a target control temperature Td of the electronic device 200 (S30). For example, the setting is 60° C. The temperature predicting unit 150 also passes the current temperature measured by the temperature measuring unit 108 to the electric fan control unit 130. The rotation number calculating unit 132 multiplies the difference between the set target control temperature Td and the current temperature $T_t$ by a predetermined feedback gain k, thereby calculating the number of rotations n of the electric fan.

The number of rotations n is given by the following equation (6):

$$n = k \cdot (Td - T_t). \tag{6}$$

When the electric fan has a fixed number of rotations per unit time, the number of rotations calculated is achieved by adjusting the operating time. When the electric fan is equipped with a PWM (Pulse Width Modulation) control mechanism or the like, the number of rotations per unit time can also be controlled. The electric fan control unit 130 controls the electric fan according to the number of rotations n calculated (S32). That is, the electric fan is controlled so that the temperature of the electronic device 200 remains at or approaches the target control temperature Td.

Next, the temperature predicting unit 150 predicts the temperature of the electronic device 200 after the period Δt (S34), and passes the resultant to the electric fan control unit 130. The electric fan control unit 130 determines whether this predicted temperature exceeds a predetermined threshold or not (S36). This predetermined threshold is a value set arbitrarily by the designer in consideration of the relationship between the time response of this electric fan and the predicted temperature variation. That is, the threshold is a value beyond which a temperature that guarantees proper operation will be exceeded if the electric fan is controlled by the current feedback control. Hereinafter, this threshold will be referred to as "third threshold."

If the predicted temperature is higher than or equal to the third threshold (Y in S36), the electric fan control unit 130 revises the target control temperature Td downward (S38). The electric fan control unit 130 lets this revised target control temperature Td into the foregoing equation (6), thereby calculating the number of rotations of the electric fan. The electric fan control unit 130 controls the electric fan based on the number of rotations n (S32). It can be seen that the downward revision of the target control temperature Td increases the number of rotations n. That is, when a sharp rise in temperature is predicted, the cooling power is increased in advance so as to avoid a rise to temperatures at which proper operation is not guaranteed. Consequently, the amount of downward revision is set to a value corresponding to the predicted rise in temperature when necessary.

At step 336, if the predicted temperature is lower than the third threshold (N in s36), the electric fan control unit 130 determines whether the predicted temperature exceeds a predetermined threshold or not (S40). This predetermined threshold is a temperature at which unnecessary overcooling occurs. The temperature is also set in view of avoiding unfavorable temperature fluctuations. Hereinafter, this threshold will be referred to as "fourth threshold."

If the predicted temperature is lower than or equal to the fourth threshold (Y in S40), the electric fan control unit 130 revises the target control temperature Td upward (S42). The electric fan control unit 130 lets this revised target control temperature Td into the foregoing equation (6), thereby calculating the number of rotations n of the electric fan. The electric fan control unit 130 then controls the electric fan based on the number of rotations n (S32). It can be seen that the upward revision of the target control temperature Td decreases the number of rotations n. That is, when a drop in temperature is predicted, the cooling power is lowered or the rotation of the electric fan is stopped in advance so as to avoid overcooling. Consequently, the amount of upward revision is set to a value corresponding to the predicted drop in temperature when necessary.

At step S40, if the predicted temperature exceeds the fourth threshold (N in S40), the electric fan control unit 130 restores the target control temperature Td to its initial value (S44). If not revised, the target control temperature Td is simply maintained. Such processing is continued subsequently while the electronic device 200 is in operation (N in S46). If the operation is stopped (Y in S46), this cooling processing is ended.

According to the present embodiment, when a sharp rise in temperature is predicted, more powerful cooling than in an ordinary state is effected in advance. This can prevent the electronic device from rising in temperature transiently due to a difference between the temperature time constant of the load on the electronic device and the temperature time constant of the cooling control system. The prediction-based cooling also eliminates the need to provide a guard band including the margin of rise in temperature in advance so that the control temperature becomes lower. It is therefore possible to avoid an overcooling state under light loads. In the meantime, the electric fan is prevented from excessive rotations, thereby allowing a reduction in power consumption and noise. The volume of the electric fan can also be suppressed. Since temperature variations can be reduced to uniformize the temperature, it is possible to reduce repetition fatigue of solder joints which are arranged between the silicon and mounting boards having different coefficients of thermal expansion. The smaller differences in temperature decrease the number of cycles of fatigue significantly.

Up to this point, the present invention has been described in conjunction with the embodiments thereof. It should be noted that the present invention is not limited to these embodiments, and various modifications thereof are also applicable as aspects of the present invention. For example, the first embodiment has dealt with the method of cooling the electronic device in cooperation of two types of cooling units which are based on different cooling principles. The cooling units are not limited to the two types, however. It will be understood by those skilled in the art that the cooling units may be designed in a variety of ways depending on the layout and the use environment of the electronic device.

The system for supplying the refrigerant to the jet cooling apparatus 300 and the system for recovering the used refrigerant may simply adopt the techniques used in conventional air cooling and liquid cooling methods. In the embodiments, the present invention has been described with an example where the electric fan and the jet cooling are used in combination. Nevertheless, the present invention is to propose a method of cooling the electronic device 200 by driving cooling units that are based on cooling principles of different cooling time responses. The scope of the invention is thus not limited to the cooling apparatuses described in the embodiments. For example, the heat sink 252 may be cooled by using a coolant instead of the electric fan. The cooling mechanism on the top side of the electronic device 200 may consist of the heat sink 252 alone, i.e., the heat dissipation mechanism alone. Similarly, the cooling principle having high cooling time response is not limited to the jet cooling by the jet cooling apparatus 300. For example, a water cooling method using a coolant may be used to control the heat removal from the package substrate 254. A thermoelectric device may also be used for cooling. It will be understood by those skilled in the art that various cooling methods having different cooling principles about cooling time response are available.

In the second embodiment, the temperature measuring unit 108 may measure the temperature of the heat sink 252, not the temperature of the electronic device 200. In this case, when the heat sink 252 is high in temperature, the electric fan control unit 130 rotates the electric fan to control the temperature of the heat sink 252 to the target control temperature even if the predicted load is low. Rotating the electric fan at moderate speed under a low load can provide heat inertia for the heat sink 252.

The second embodiment has dealt with the case where the electric fan control unit 130 determines the number of rotations n by multiplying the difference between the target, control temperature Td and the current temperature $T_t$ by the predetermined feedback gain k, a proportional term. Instead, an integral term may be introduced for the sake of a reduction in offset. In that case, the number of rotations n is given by the following equation (7);

$$n = k1 \cdot (Td - T_t) + k2 \cdot \int (Td - T_t) dt, \tag{7}$$

where k1 is a feedback gain for proportional components, and k2 is a feedback gain for integral components.

With the proportional term alone, the feedback gain k1 must be made greater for the sake of a reduction in offset. This can sometimes cause fluctuations, however. The integral term can thus be introduced to avoid fluctuations.

While the second embodiment has dealt with the case of applying feedback control to the electric fan, it is also applicable to the jet cooling apparatus 300. In that case, the number of rotations of the electric fan will not be controlled, but the time for the nozzle control unit 120 to spray the refrigerant is calculated. The time ratio between when the refrigerant is sprayed and when not may be calculated. For electronic devices which can easily cause sharp changes in temperature, it is possible to reduce offsets as compared to the case where the electric fan is used for cooling,

What is claimed is:

1. An electronic device cooling apparatus comprising:
   a predicting unit which predicts a temperature of an electronic device for executing given instructions from an operating load by analyzing the instructions, wherein the predicting unit determines a speed of change of the predicted temperature; and
   a control unit which controls a cooling unit based on the speed of change of the predicted temperature, the cooling unit cooling the electronic device.

2. The electronic device cooling apparatus according to claim 1, wherein;
   the control unit selects and operates a selected cooling unit out of a plurality of cooling units having different cooling time responses, depending on the speed of change of the predicted temperature.

3. The electronic device cooling apparatus according to claim 1, wherein;
   the control unit selects and operates a selected cooling unit out of a plurality of cooling units having different cooling efficiencies, depending on the speed of change of the predicted temperature.

4. The electronic device cooling apparatus according to claim 2, wherein
   when the speed exceeds a predetermined threshold, a cooling unit of spray type is selected.

5. The electronic device cooling apparatus according to claim 3, wherein
   when the speed exceeds a predetermined threshold, a cooling unit of spray type is selected.

6. The electronic device cooling apparatus according to claim 1, wherein;
   the control unit decreases a predetermined control target value of temperature control of the cooling unit for cooling when a rise in temperature is predicted.

7. The electronic device cooling apparatus according to claim 1, wherein;
   the control unit increases a predetermined control target value of temperature control of the cooling unit for cooling when a drop in temperature is predicted.

8. An electronic device cooling apparatus comprising:
   a measuring unit which measures a temperature of an electronic device for executing given instructions; and
   a control unit which exercises feedback control on a cooling mechanism to eliminate an offset between the measured temperature measured by the measuring unit and a predetermined control target value; and
   a predicting unit which predicts the temperature of the electronic device from an operating load by analyzing the instructions, the predicting unit determining a speed of change of the predicted temperature, wherein
   the control unit adjusts the control target value based on the speed of change or the predicted temperature.

9. The electronic device cooling apparatus according to claim 8, wherein
   the control unit introduces an integral term for reducing an offset between the control target value and an actual temperature into the feedback control.

10. An electronic device system comprising:
    an electronic device for executing given instructions;
    at least one cooling unit which cools the electronic device;
    a predicting unit which predicts a temperature of the electronic device from an operating load by analyzing the instructions, wherein the predicting unit determines a speed of change of the predicted temperature; and
    a control unit which controls the cooling unit based on the speed of change of the predicted temperature.

11. An electronic device system comprising:
    an electronic device for executing given instructions;
    a cooling unit which cools the electronic device;
    a measuring unit which measures a temperature of the electronic device;
    a control unit which exercises feedback control on the cooling unit to eliminate an offset between the measured temperature measured by the measuring unit and a predetermined control target value; and
    a predicting unit which predicts the temperature of the electronic device from an operating load by analyzing the instructions, the predicting unit determining a speed of change of the predicted temperature, wherein
    the control unit adjusts the control target value based on the speed of change of the predicted temperature.

12. A method of cooling an electronic device, comprising:
    predicting a temperature of an electronic device for executing given instructions from an operating load by analyzing the instructions, the predicting further including determining a speed of change of the predicted temperature; and
    controlling a cooling mechanism for cooling the electronic device based on the speed of change of the predicted temperature.

13. The method of cooling an electronic device according to claim 12, wherein;
    a selected cooling mechanism is selected and operated out of a plurality of cooling mechanisms having different cooling time responses, depending on the speed of change of the predicted temperature.

14. The method of cooling an electronic device according to claim 12, wherein;
    selected cooling mechanism is selected and operated out of a plurality of cooling mechanisms having different cooling efficiencies, depending on the speed of change of the predicted temperature.

15. The method of cooling an electronic device according to claim 12, wherein;
    a predetermined control target value of temperature control of the cooling mechanism is decreased for cooling when a rise in temperature is predicted.

16. The method of cooling an electronic device according to claim 12, wherein;
    a predetermined control target value of temperature control of the cooling mechanism for cooling when a drop in temperature is predicted.

17. A method of cooling an electronic device, comprising:
    inputting a temperature of an electronic device for executing given instructions, and exercising feedback control on a cooling mechanism so that the temperature becomes a predetermined control target value;
    predicting the temperature of the electronic device from an operating load by analyzing the instructions, the predicting further including determining a speed of change of the predicted temperature; and adjusting the control target value based on the speed of chance of the predicted temperature.

18. The method of cooling an electronic device according to claim 17, wherein
an integral term for reducing an offset between the control target value and an actual temperature is introduced into the feedback control.

19. An electronic device cooling program for making a computer exercise the functions of:
predicting a temperature of an electronic device for executing given instructions from an operating load by analyzing the instructions, the predicting further including determining a speed of change of the predicted temperature; and
controlling a cooling mechanism for cooling the electronic device based on the speed of change of the predicted temperature.

20. An electronic device cooling program for making a computer exercise the functions of:
inputting a temperature of an electronic device for executing given instructions, and exercising feedback control on a cooling mechanism so that the temperature becomes a predetermined control target value;
predicting the temperature of the electronic device from an operating load by analyzing the instructions, the predicting further including determining a speed of change of the predicted temperature; and
adjusting the control target value based on the speed of change of the predicted temperature.

21. A computer-readable recording medium containing an electronic device cooling program for making a computer exercise the functions of:
predicting a temperature of the electronic device for executing given instructions from an operating load by analyzing the instructions, the predicting further including determining a speed of change of the predicted temperature; and
controlling a cooling mechanism for cooling the electronic device based on the speed of change of the predicted temperature.

22. A computer-readable recording medium containing an electronic device cooling program for making a computer exercise the functions of:
inputting a temperature of an electronic device for executing given instructions, and exercising feedback control on a cooling mechanism so that the temperature becomes a predetermined control target value;
predicting the temperature of the electronic device from an operating load by analyzing the instructions, the predicting further including determining a speed of change of the predicted temperature; and
adjusting the control target value based on the speed of change of the predicted temperature.

* * * * *